United States Patent
Dahlstrom

(10) Patent No.: US 10,157,816 B2
(45) Date of Patent: *Dec. 18, 2018

(54) PHASE CHANGING ON-CHIP THERMAL HEAT SINK

(71) Applicant: INTERNATIONAL BUSINESS MACHINES CORPORATION, Armonk, NY (US)

(72) Inventor: Mattias E. Dahlstrom, Los Alto, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/899,791

(22) Filed: Feb. 20, 2018

(65) Prior Publication Data

US 2018/0182687 A1 Jun. 28, 2018

Related U.S. Application Data

(60) Continuation of application No. 14/928,206, filed on Oct. 30, 2015, now Pat. No. 9,984,954, which is a
(Continued)

(51) Int. Cl.
*H01L 23/427* (2006.01)
*H01L 21/762* (2006.01)
(Continued)

(52) U.S. Cl.
CPC ...... *H01L 23/4275* (2013.01); *H01L 21/0217* (2013.01); *H01L 21/02118* (2013.01);
(Continued)

(58) Field of Classification Search
CPC ......... H01L 2924/00; H01L 2924/0002; H01L 21/02118; H01L 21/02164; H01L 21/0217;
(Continued)

(56) References Cited

U.S. PATENT DOCUMENTS 4,446,916 A 5/1984 Hayes
4,605,343 A 8/1986 Hibbs et al.
(Continued)

FOREIGN PATENT DOCUMENTS

| CN | 101557697 | 10/2009 |
|----|-----------|---------|
| JP | 600004244 | 1/1985  |
| TW | M263732   | 5/2005  |

OTHER PUBLICATIONS

Notice of Allowance from U.S. Appl. No. 14/712,083 dated Mar. 26, 2018; 8 pages.

*Primary Examiner* — Mohsen Ahmadi
*Assistant Examiner* — Patricia Reddington
(74) *Attorney, Agent, or Firm* — Steven J. Meyers; Andrew M. Calderon; Roberts Mlotkowski Safran Cole & Calderon, P.C.

(57) ABSTRACT

A method of forming an on-chip heat sink includes forming a device on a substrate. The method also includes forming a plurality of insulator layers over the device. The method further includes forming a heat sink in at least one of the plurality of insulator layers and proximate to the device. The heat sink includes a reservoir of phase change material having a melting point temperature that is less than an upper limit of a design operating temperature of the chip.

12 Claims, 7 Drawing Sheets

Related U.S. Application Data continuation of application No. 14/528,078, filed on Oct. 30, 2014, now Pat. No. 9,287,141, which is a division of application No. 13/731,716, filed on Dec. 31, 2012, now Pat. No. 9,059,130.

(51) Int. Cl.

| | |
|---|---|
| *H01L 21/02* | (2006.01) |
| *H01L 23/367* | (2006.01) |
| *H01L 21/48* | (2006.01) |
| *H01L 21/768* | (2006.01) |
| *H01L 23/373* | (2006.01) |
| *H01L 49/02* | (2006.01) |
| *H01L 23/00* | (2006.01) |
| *H01L 23/528* | (2006.01) |
| *H01L 23/532* | (2006.01) |
| *H01L 23/34* | (2006.01) |
| *H01L 23/36* | (2006.01) |
| *H01L 23/522* | (2006.01) |

(52) U.S. Cl.
CPC ...... *H01L 21/02164* (2013.01); *H01L 21/481* (2013.01); *H01L 21/4817* (2013.01); *H01L 21/4882* (2013.01); *H01L 21/76224* (2013.01); *H01L 21/76802* (2013.01); *H01L 21/76843* (2013.01); *H01L 21/76898* (2013.01); *H01L 23/367* (2013.01); *H01L 23/3675* (2013.01); *H01L 23/3677* (2013.01); *H01L 23/373* (2013.01); *H01L 23/3735* (2013.01); *H01L 23/3736* (2013.01); *H01L 23/427* (2013.01); *H01L 23/528* (2013.01); *H01L 23/5226* (2013.01); *H01L 23/5329* (2013.01); *H01L 24/80* (2013.01); *H01L 28/24* (2013.01); *H01L 23/345* (2013.01); *H01L 23/36* (2013.01); *H01L 23/522* (2013.01); *H01L 2924/00* (2013.01); *H01L 2924/0002* (2013.01); *H01L 2924/13091* (2013.01)

(58) Field of Classification Search
CPC ............... H01L 21/481; H01L 21/4817; H01L 21/4882; H01L 21/76224; H01L 21/76802; H01L 21/76843; H01L 21/76898; H01L 23/4275; H01L 23/367; H01L 23/3675; H01L 23/3677; H01L 23/373; H01L 23/3735; H01L 23/3736; H01L 23/427; H01L 23/5226; H01L 23/528; H01L 23/5329; H01L 23/36; H01L 24/80; H01L 28/24

USPC ........................................................ 257/537
See application file for complete search history.

(56) References Cited

U.S. PATENT DOCUMENTS

| | | |
|---|---|---|
| 5,007,478 A | 4/1991 | Sengupta |
| 5,198,189 A | 3/1993 | Booth et al. |
| 5,455,448 A | 10/1995 | Benjamin |
| 6,372,997 B1 | 4/2002 | Hill et al. |
| 6,665,186 B1 | 12/2003 | Calmidi et al. |
| 6,702,003 B2 | 3/2004 | Hsiao et al. |
| 6,798,066 B1 * | 9/2004 | Motsiff ................. H01L 23/60 257/173 |
| 6,809,421 B1 | 10/2004 | Hayasaka et al. |
| 6,940,721 B2 | 9/2005 | Hill |
| 7,203,064 B2 | 4/2007 | Mongia et al. |
| 7,433,190 B2 | 10/2008 | Kehl et al. |
| 7,964,959 B2 | 6/2011 | Jung |
| 8,299,515 B2 | 10/2012 | Ervin et al. |
| 9,059,130 B2 | 6/2015 | Dahlstrom |
| 9,312,147 B2 | 4/2016 | Dahlstrom |
| 2002/0113250 A1 | 8/2002 | Chaiken et al. |
| 2004/0081843 A1 | 4/2004 | Bunyan |
| 2005/0017338 A1 | 1/2005 | Fukazawa |
| 2005/0199376 A1 | 9/2005 | Lee |
| 2006/0028801 A1 | 2/2006 | Mayer |
| 2006/0151146 A1 | 7/2006 | Chou et al. |
| 2006/0289848 A1 | 12/2006 | Dennison |
| 2007/0097739 A1 | 5/2007 | Happ et al. |
| 2007/0181974 A1 | 8/2007 | Coolbaugh et al. |
| 2008/0122061 A1 | 5/2008 | Edwards |
| 2008/0224257 A1 | 9/2008 | Mori |
| 2008/0246064 A1 | 10/2008 | Kimura |
| 2008/0285333 A1 | 11/2008 | Lankhorst et al. |
| 2009/0025907 A1 | 1/2009 | Wenger |
| 2009/0056914 A1 | 3/2009 | Ruijl et al. |
| 2009/0160013 A1 | 6/2009 | Abou-Khalil et al. |
| 2010/0230779 A1 | 9/2010 | Anderson et al. |
| 2011/0037042 A1 | 2/2011 | Breitwisch et al. |
| 2011/0073997 A1 | 3/2011 | Leuschner et al. |
| 2011/0089394 A1 | 4/2011 | Kakegawa |
| 2011/0189860 A1 | 8/2011 | Porshnev |
| 2011/0310562 A1 | 12/2011 | Strader et al. |
| 2012/0001679 A1 | 1/2012 | Privitera et al. |
| 2012/0055612 A1 | 3/2012 | Ahmed et al. |
| 2012/0108020 A1 | 5/2012 | Baldwin et al. |
| 2012/0133030 A1 | 5/2012 | Wang et al. |
| 2012/0146098 A1 | 6/2012 | Dahlstrom et al. |
| 2012/0181663 A1 | 7/2012 | Lukaitis et al. |
| 2013/0141967 A1 | 6/2013 | Cho et al. |
| 2013/0256872 A1 | 10/2013 | Su et al. |
| 2013/0256895 A1 | 10/2013 | Su et al. |
| 2013/0299950 A1 | 11/2013 | Hummler |
| 2014/0361440 A1 | 12/2014 | Bar et al. |

\* cited by examiner

PHASE CHANGING ON-CHIP THERMAL HEAT SINK

FIELD OF THE INVENTION

The invention relates to integrated circuit devices and, more particularly, to methods and systems for dissipating heat in semiconductor devices.

BACKGROUND

Heat can be removed from a device (e.g., transistor, power amplifier, etc.) in an integrated circuit chip using either the substrate itself down to a heat sink, or using wiring that is formed over the device as a heat path for transferring heat away from the device and out of the top of the chip. Such wiring, however, typically has a primary purpose of carrying electric current within the chip and is not primarily optimized for heat transfer. The electric current generates its own heat within the wiring through resistive heating, and the combination of resistive heating and heat transfer from devices can degrade the reliability and the current handling capacity of the wiring.

According to Moore's law of scaling, both the current density and the circuit density increase with each generation. In combination with exotic substrates with limited thermal conductivity such as GaAs or silicon-on-insulator (SOI), the thermal budget limitations in a chip are becoming more and more severe. Circuits or subcircuits typically use the full power budget for only a limited amount of time, often for fractions of milliseconds. With current technology, the power and temperature budget need to account for the heat generated during these periods.

Accordingly, there exists a need in the art to overcome the deficiencies and limitations described hereinabove, particularly of a temporal nature.

SUMMARY

In a first aspect of the invention, there is a method of manufacturing an integrated circuit chip. The method includes forming a device on a substrate. The method also includes forming a plurality of insulator layers over the device. The method further includes forming a heat sink in at least one of the plurality of insulator layers and proximate to the device. The heat sink comprises a reservoir of phase change material having a melting point temperature that is less than an upper limit of a design operating temperature of the chip.

In another aspect of the invention, there is a method of manufacturing an integrated circuit chip. The method includes forming a heat sink in a substrate by: forming a trench in the substrate; forming a liner on surfaces of the trench; forming a phase change material on the liner and in the trench, wherein the phase change material has a melting point temperature that is less than an upper limit of a design operating temperature of the chip; and forming a cap on the phase change material and in the trench. The method also includes thinning a backside of the substrate to expose a portion of the liner. The method further includes forming a device on a front side of the substrate proximate the heat sink.

In another aspect of the invention, a semiconductor structure includes a device on a substrate of an integrated circuit chip, and a heat sink proximate to the device. The heat sink comprises a core composed of a phase change material having a melting point temperature that is less than an upper limit of a design operating temperature of the chip.

In another aspect of the invention, a semiconductor structure includes: a substrate; a buried insulator layer on the substrate; a semiconductor layer on the buried insulator layer; an isolation region in the semiconductor layer; and a resistor on the isolation region. The resistor is composed of a phase change material that is configured to be in a liquid phase during operation of the resistor.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an on-chip heat sink comprising a phase change material, which comprises the structures of the present invention. In still further embodiments, a method in a computer-aided design system is provided for generating a functional design model of the on-chip heat sink comprising a phase change material. The method comprises generating a functional representation of the structural elements of the on-chip heat sink comprising a phase change material.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuit devices and, more particularly, to methods and systems for dissipating heat in semiconductor devices. According to aspects of the invention, a heat sink comprising a phase change material is formed in a cavity in one or more layers of an integrated circuit chip. In embodiments, the phase change material has a melting point temperature that is less than an upper limit of a design operating temperature of the chip. The heat sink comprising the phase change material may be thermally linked to an external heat sink that is arranged on an outer surface of the chip. In this manner, implementations of the invention provide an efficient mechanism for preventing temperature spikes that can be very damaging to the components of the chip.

Aspects of the invention may be used, for example, with a sub-circuit that uses its full power for a short duration, e.g., a power amplifier in a wireless communication system may have a full power transmission window of a few microseconds. Implementations of the invention smooth out the peaks of the localized chip temperature due to such short duration events, and this permits an external heat sink to the dimensioned less aggressively and manufactured less expensively. In an additional application, the phase change material heat sink may be used in it melted state as a precision resistor, relying on the fact that melted metal has no grains which eliminates a cause of resistor variability.

Figure 1:
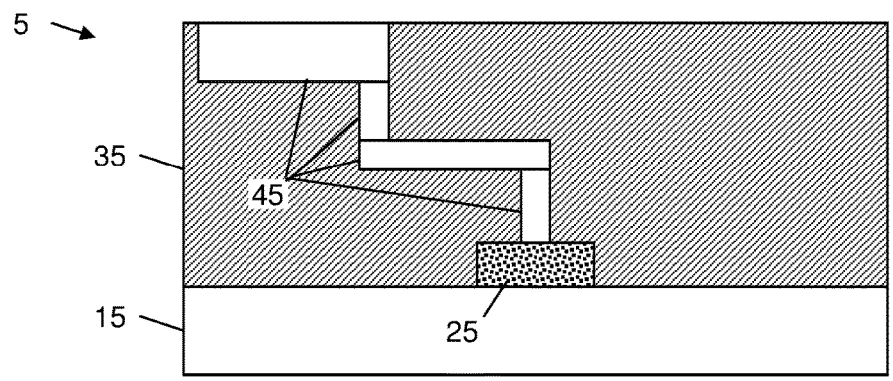
FIGS. 1-19 show processing steps and structures in accordance with aspects of the invention.

FIGS. 1-19 show processing steps and structures in accordance with aspects of the invention. In particular, FIG. 1 shows a cross section of a portion of a semiconductor structure 5 comprising a substrate 15, a device 25 formed on the substrate 15, a plurality of insulator layers 35 formed over the device 25 and the substrate 15, and a plurality of electrically conductive elements 45 formed in the insulator layers 35. The substrate 15, device 25, insulator layers 35, and conductive elements 45 may be composed of conventional semiconductor materials and may be formed using conventional semiconductor fabrication processes.

The substrate 15 may comprise any suitable substrate, such as a silicon-on-insulator (SOI) substrate (e.g., including a substrate, a buried insulator layer, and a semiconductor layer) or bulk material substrate (e.g., including doped regions typically referred to as wells). The substrate 15 may be composed of any suitable material including, but not limited to, Si, SiGe, SiGeC, SiC, GE alloys, GaAs, InAs, InP, and other III/V or II/VI compound semiconductors.

The device 25 may comprise any desired type of integrated circuit device including, but not limited to, a metal oxide semiconductor field effect transistor (MOSFET), a heterojunction bipolar transistor (HBT), etc. The device 25 may be a power device, for example, a power amplifier, a power diode, part of a processor core, etc., which generates a significant amount of heat during operation. The device 25 may be formed on a top surface of the substrate 15 and may extend partially into the substrate 15. Any number of devices 25 may be present in the structure 5.

The insulator layers 35 may comprise any desired number of layers of electrically insulating material (e.g., dielectric material), such as silicon dioxide ($SiO_2$), tetraethylorthosilicate (TEOS), borophosphosilicate glass (BPSG), hydrogen silsesquioxane (HSQ), etc. Such layers are commonly referred to as interlevel dielectric (ILD) layers, wiring levels, etc. A lowermost one of the insulator layers 35 has a vertical thickness sufficient to cover (e.g., encapsulate) the device 25, while subsequent ones of the insulator layers 35 may have any desired thickness ranging, for example, from about 0.2 μm for the lower layers to about 4-6 μm for the upper layers.

The plurality of electrically conductive elements 45 may comprise, for example, contacts, wires, vias, and/or interconnects, etc., and are structured to provide an electrically conductive pathway to a portion of the device 25. The electrically conductive elements 45 may be composed of any suitable material (e.g., copper, etc.) and may be formed using conventional techniques (e.g., forming trenches in the insulator layers 35 and filling the trenches with conductive material, etc.).

Figure 2:
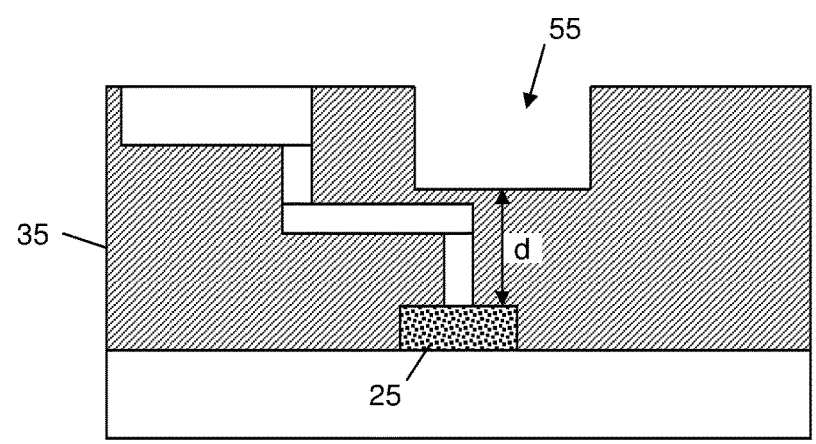

As depicted in FIG. 2, a trench 55 (e.g., cavity) is formed in at least one layer of the insulator layers 35. The trench 55 may be formed using photolithographic masking and etching. For example, a photomask may provided by forming a layer of photoresist material on the uppermost one of the insulator layers 35, exposing the photoresist material to a pattern of light, and developing the exposed photoresist material. An etching process, such as one or more reactive ion etch (RIE) processes, may then be used to form the trench 55 extending from the top surface of the uppermost one of the insulator layers 35 downward toward the device 25 by removing material not covered by the photomask. After etching, the photomask may be removed using a conventional ashing or stripping process.

Still referring to FIG. 2, the trench 55 may extend into only a single one of the insulator layers 35, or alternatively may extend into more than one of the insulator layers 35. In accordance with aspects of the invention, the trench 55 is located at a distance "d" from the device 25 that is: (i) sufficiently small to ensure efficient thermal coupling between the device 25 and a heat sink material later formed in the trench 55, and (ii) sufficiently large to avoid inducing parasitic capacitance between the device 25 and the heat sink material later formed in the trench 55. In this manner, the resultant heat sink is formed proximate to the device 25. In embodiments, the distance "d" is in the range of about 5 μm to about 10 μm, although the invention is not limited to this distance and smaller distances may be used when parasitic capacitance can be avoided. In embodiments, the trench 55 has a vertical depth (e.g., thickness) in a range of about 1 μm to about 5 μm, and an area (e.g., in plan view) in a range of about 10 μm to about 100 μm. The invention is not limited to these dimensions, however, and any suitable size trench 55 may be used within the scope of the invention. In additional embodiments, the trench 55 vertically overlaps the device 25 (e.g., a single vertical line intersects both the trench 55 and the device 25.)

Figure 3:
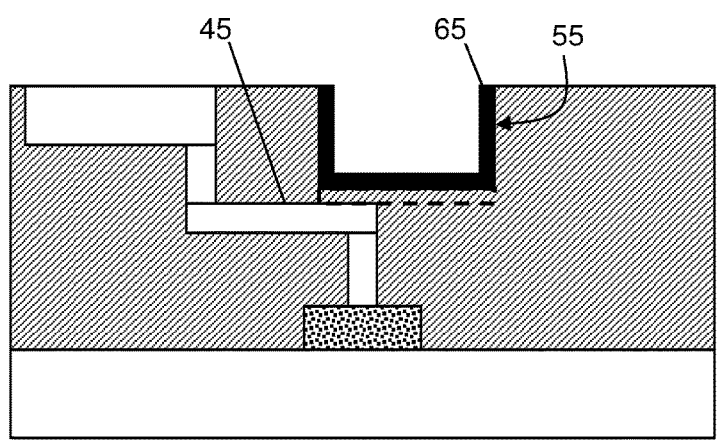

As depicted in FIG. 3, a liner 65 is formed on the exposed surfaces of the trench 55, e.g., contacting the material of one or more of the insulator layers 35. The liner 65 may be formed using conventional semiconductor processes and may comprise any suitable diffusion barrier material. In embodiments, the liner 65 is formed using a conformal deposition process, such as chemical vapor deposition (CVD), and is composed of a diffusion barrier material such as titanium nitride (TiN), silicon nitride (SiN), etc. The liner 65 may be formed to any desired thickness sufficient to provide a sufficient diffusion barrier for the phase change material that will be contained in the remainder of the trench 55. For example, the liner 65 may have a thickness in a range of about 4 nm to 40 nm, although other thicknesses may be used within the scope of the invention.

In embodiments, when the liner 65 is composed of an electrical insulator material (e.g., SiN, etc.), the trench 55 may be formed to extend to one or more of the electrically conductive elements 45, such that a portion of the liner 65 is formed directly on the one or more of the electrically conductive elements 45 (e.g., an emitter contact of the device 25), e.g., as depicted by the dashed lines in FIG. 3. In other embodiments, the liner 65 may be composed of an electrical conductive material, which permits the heat sink to be part of a wiring network that is electrically connected to a device or sub-circuit.

Figure 4:
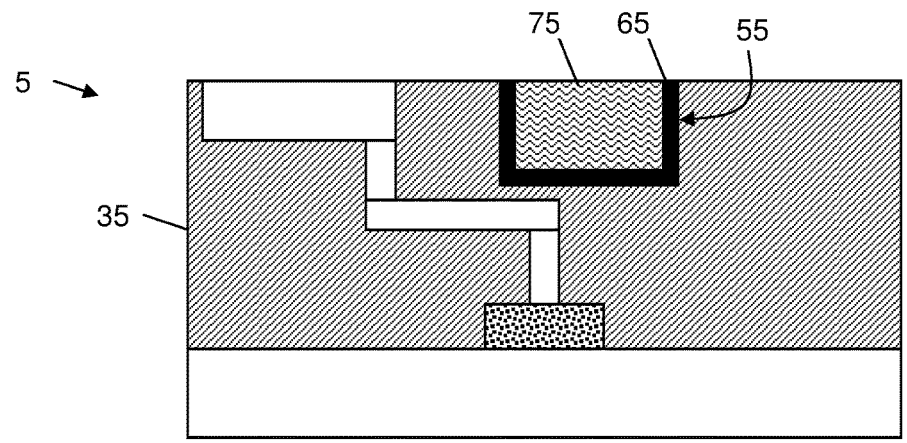

As depicted in FIG. 4, a core 75 is formed in the trench 55 on the liner 65. In accordance with aspects of the invention, the core 75 comprises a phase change material having a melting point temperature that is less than an upper limit of a design operating temperature of the chip. In a non-limiting example, the upper limit of a design operating temperature of the chip may be about 105° C., and the phase change material may be configured to have a melting point in a range between about 50° C. and about 100° C.

In embodiments, the core 75 is composed of an alloy comprising gallium (Ga) and at least one of indium (In), zinc (Zn), tin (Sn), gold (Au), and copper (Cu). The ratio of the constituent elements of the alloy forming the core 75 may be adjusted to achieve a desired melting point for the core 75. The core 75 may be formed, for example, by a CVD process that deposits a film of the alloy (e.g., InGa) in the trench using a temperature controlled chamber that maintains the structure 5 at a temperature that is sufficiently low (e.g., cool) to maintain the deposited alloy in a solid state. The core 75 may also be formed, for example, by plural CVD processes in which layers of the individual constituents of the alloy (e.g., In and Ga) are alternately formed within the trench 55. The core 75 may also be formed, for example, using an electrodeposition process that utilizes a gallium electroplating bath with alloying elements added directly to the bath.

Still referring to FIG. 4, the deposition of the core 75 may result in the formation of excess material on the upper surface of the uppermost one of the insulator layers 35. The excess material (e.g., alloy) is removed using a planarization process. Any suitable planarization process may be used, such as an endpoint etch or chemical mechanical polish (CMP).

Figure 5:
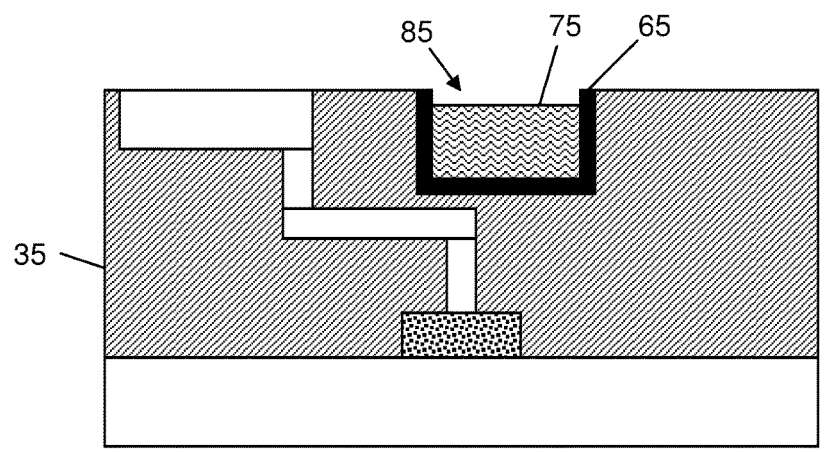

As depicted in FIG. 5, the core 75 is recessed to form a trench 85. The trench 85 may be formed using any suitable technique, such as a timed etch of the core 75 material, e.g., using an RIE process that removes the material of the core 75 but avoids removing material of the insulator layers 35 and liner 65.

Figure 6:
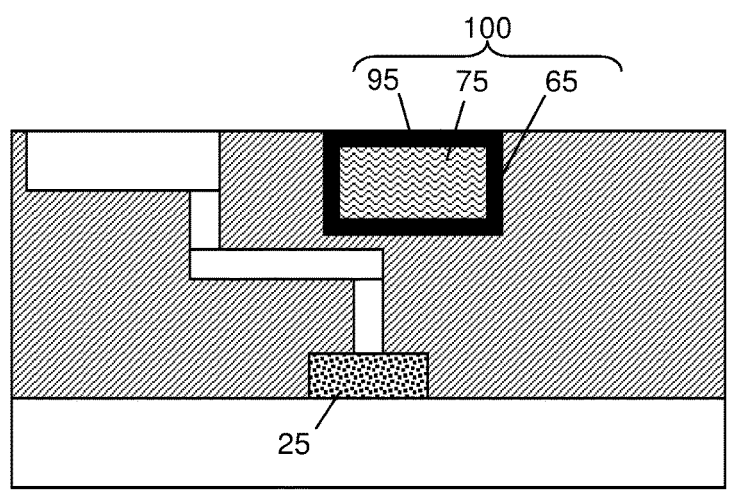

As shown in FIG. 6, a cap 95 is formed in the trench 85 on the upper surface of the core 75. In embodiments, the cap 85 is composed of the same material as the liner 65. The cap 95 may be formed using any desired fabrication technique, such as CVD. A planarization process, e.g., CMP, may be performed after forming the cap 95.

In accordance with aspects of the invention, the core 75 encapsulated by the liner 65 and cap 95 constitutes an on-chip heat sink 100 comprising a reservoir of phase change material that provides enhanced heat dissipation for the device 25. Heat generated by the device 25 (e.g., when the device 25 receives a power surge) is absorbed by the on-chip heat sink 100 and causes the temperature of the core 75 to increase toward the melting point of the core 75. As the core 75 begins to melt (e.g., change from a solid phase to a liquid phase), the heat of formation temporarily absorbs energy and keeps the core 75 temperature close to the melting point until substantially all the core 75 is melted. While melting from a solid to a liquid, the core 75 remains at substantially a same temperature while it continues to absorb heat from the device 25 (e.g., as latent heat). Melting the core 75 absorbs about 125 to 300 times the amount of energy required to increase a same volume of silicon one degree Celsius. For example, heating 1000 $\mu m^3$ of silicon requires about 1.6 nJ (nano-Joule), whereas melting 1000 $\mu m^3$ of InGa requires about 210-470 nJ. In this manner, implementations of the invention keep the device 25 relatively cool at least until the core 75 is fully melted.

Figure 7:
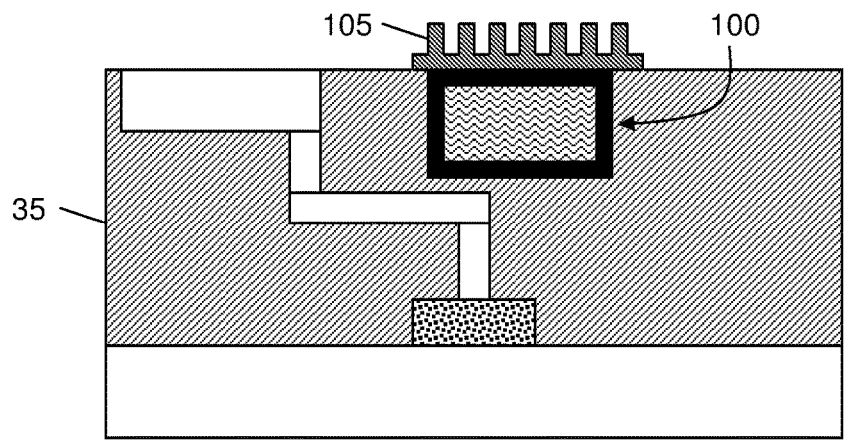

As depicted in FIG. 7, an external heat sink 105 may be thermally connected to the on-chip heat sink 100. The external heat sink 105 may comprise any conventional heat sink apparatus that is formed or connected externally to the chip. For example, the external heat sink 105 may comprise a metal layer deposited and patterned on the outer surface of the uppermost one of the insulator layers 35. As another example, the external heat sink 105 may comprise a pre-formed metal structure that is connected to the uppermost one of the insulator layers 35, e.g., via a thermal interface material. The external heat sink 105 promotes heat transfer away from the on-chip heat sink 100, thus permitting the core 75 to cool and solidify when the device 25 temporarily stops generating heat (e.g., between power surges of the device 25).

Figure 8:
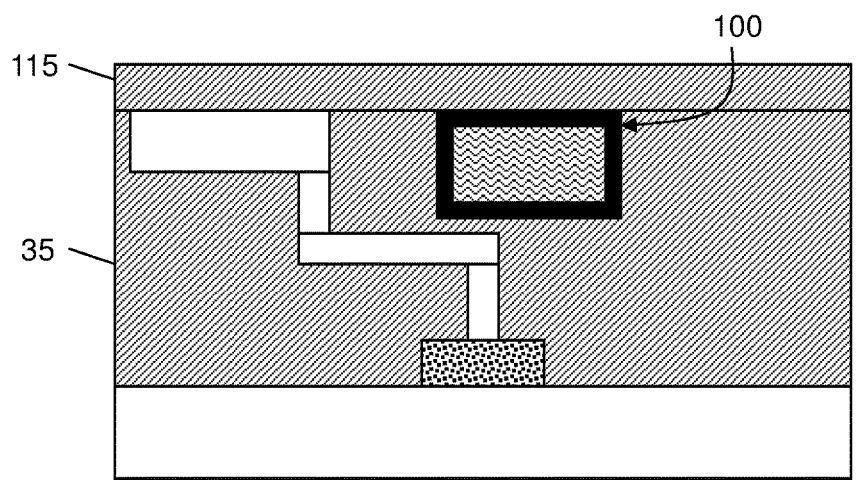

As depicted in FIG. 8, at least one insulator layer 115 may be formed over the uppermost one of the insulator layers 35 and the on-chip heat sink 100 in the structure of FIG. 6. For example, the uppermost one of the insulator layers 35 in which the trench 55 was formed may comprise an intermediate wiring level, and the at least one insulator layer 115 may comprise a last wiring level. The at least one insulator layer 115 may be composed of the same material as the insulator layers 35.

Figure 9:
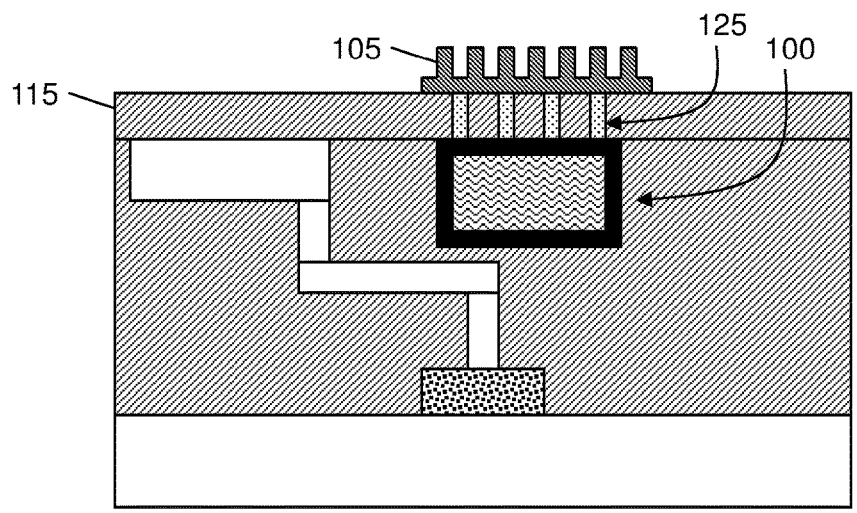

FIG. 9 shows adding an external heat sink 105 to the structure of FIG. 8. In embodiments, the external heat sink 105 is formed on or connected to the uppermost surface of the at least one insulator layer 115 (e.g., in a manner similar to that described with respect to FIG. 7). Prior to adding the external heat sink 105, at least one thermal link 125 may be formed in the at least one insulator layer 115 and in contact with the heat sink 100. In embodiments, the at least one thermal link 125 comprises a wire or via that is formed by etching a trench in the at least one insulator layer 115 and forming a thermally conductive material (e.g., metal) in the trench (e.g., via CVD).

Figure 10:
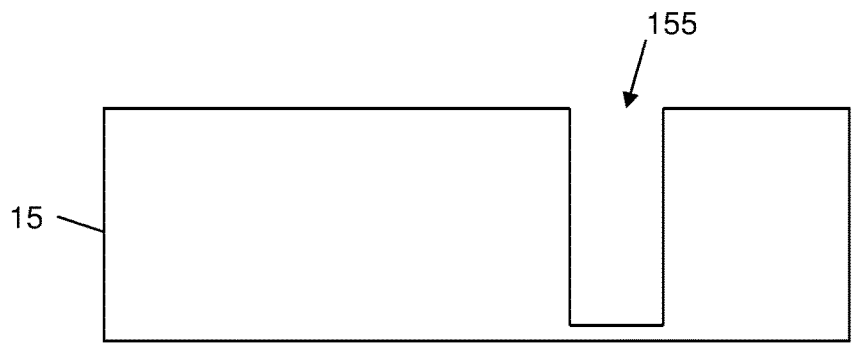
Figure 11:
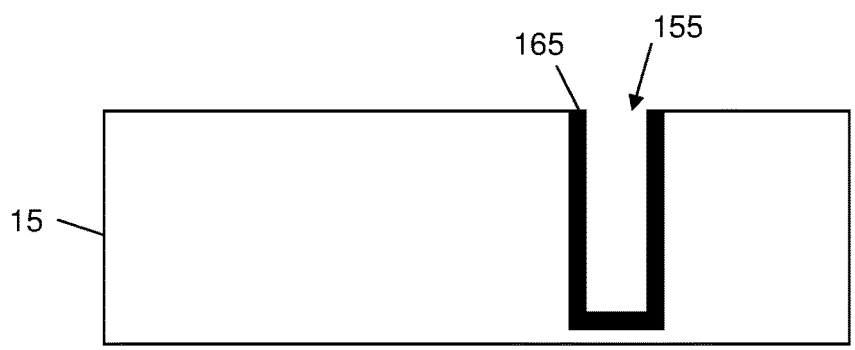
Figure 12:
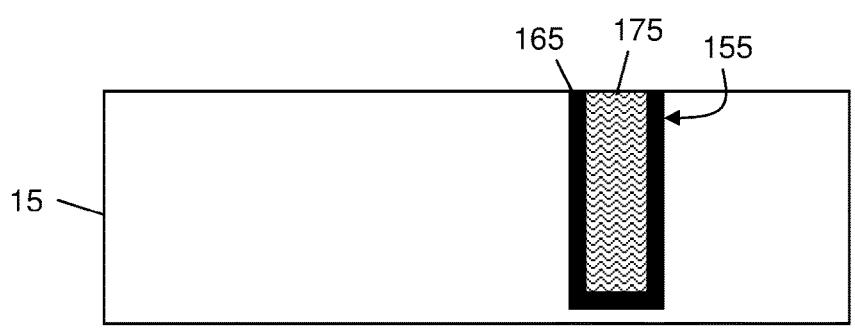
Figure 13:
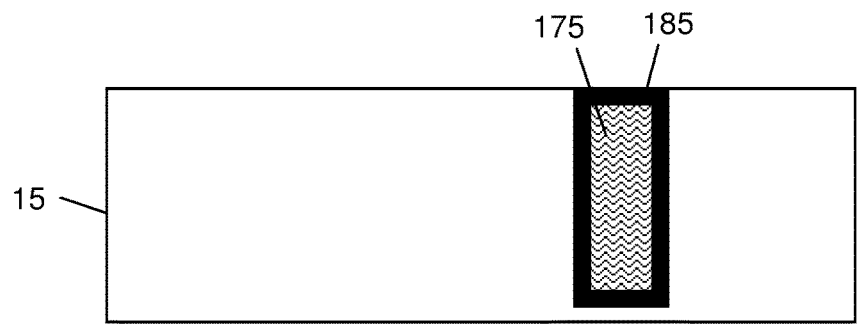

FIGS. 10-15 illustrate an implementation of the invention in which an on-chip heat sink is formed in a substrate a rather than in insulator layers above the substrate. In accordance with aspects of the invention, the heat sink a may be formed in a substrate as a through-silicon-via (also referred to as a through-wafer-via). For example, as shown in FIG. 10, a trench 155 may be formed in the substrate 15. As described herein, the substrate 15 may be an SOI substrate or a bulk silicon substrate, and the trench 155 may be formed using photolithographic masking and etching techniques. As shown in FIG. 11, a liner 165 may be formed on the surfaces of the trench 155. The liner 165 may be similar to liner 65. As shown in FIG. 12, a core 175 may formed in the remainder of the trench 155 on the liner 165. The core 175 may be similar to core 75. As shown in FIG. 13, the core 175 may be recessed and a cap 195 may be formed on the core 175 to form the on-chip heat sink 100'. The cap 195 may be similar to cap 95.

Figure 14:
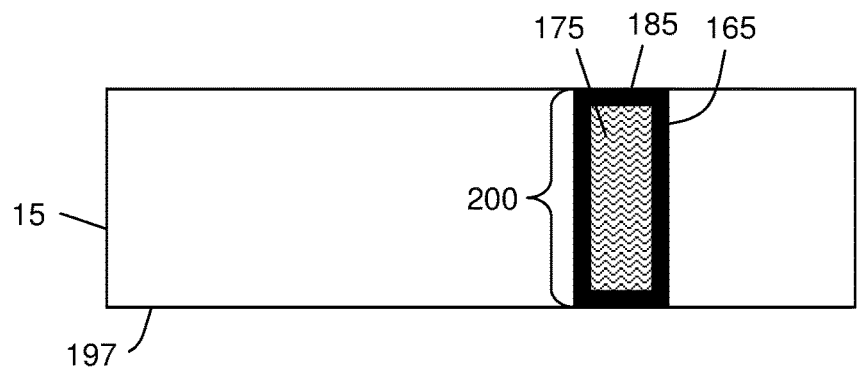
Figure 15:
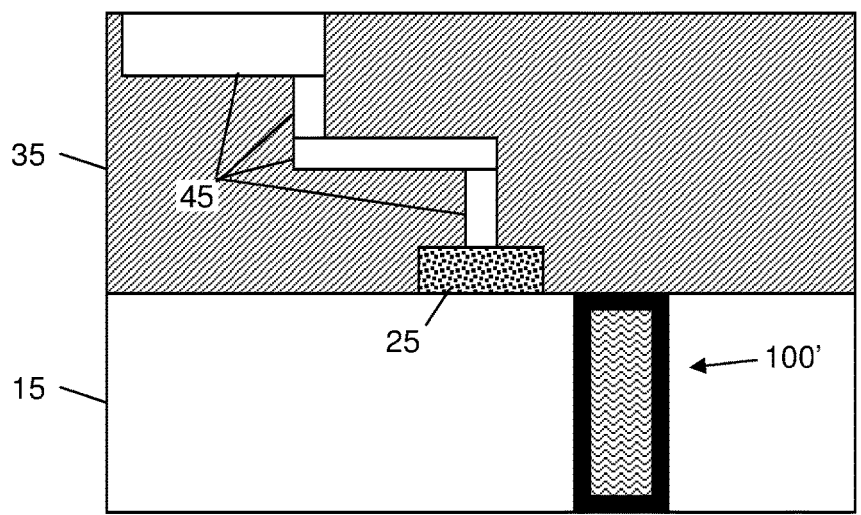

As shown in FIG. 14, a backside 197 of the substrate may be thinned (e.g., using a grinding process) until a portion of the liner 165 is exposed at the backside 197, such that the combination of the core 175 and liner 165 constitutes a through-silicon-via 200 that extends completely through the substrate 15. As shown in FIG. 15, the device 25, insulating layers 35, and electrically conductive elements 45 may be formed at the front side of the substrate 15 (e.g., opposite the backside 197) and over the on-chip heat sink 100'

In accordance with aspects of the invention, the on-chip heat sink 100' may thus be implemented earlier in the fabrication process as a through-silicon-via. The heat sink 100' may undergo a phase change (e.g., melt) while absorbing heat from the device 25 (e.g., similar to heat sink 100), and may dissipate the heat through the substrate 15 or an external heat sink that is thermally linked to the heat sink 100', e.g., at the backside 197.

Figure 16:
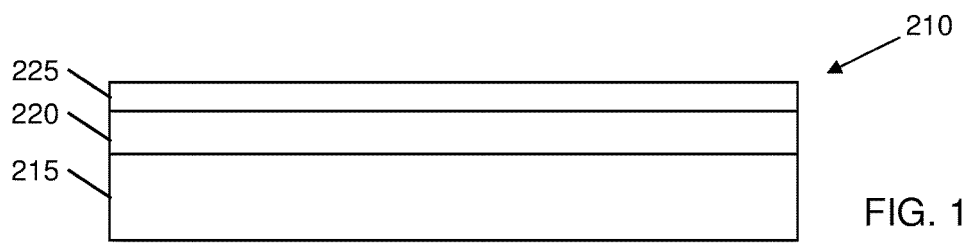

FIGS. 16-19 illustrate an implementation of the invention in which a precision resistor is composed of a phase change material. Specifically, FIG. 16 shows an exemplary SOI wafer 210 employed as an intermediate structure in implementations of the invention. The SOI wafer 210 has a semiconductor substrate 215, which is typically a silicon substrate, a buried insulator layer 220 formed on the substrate 215, and a semiconductor layer 225, which is typically a silicon layer, formed on the buried insulator layer 220. The constituent materials of the SOI wafer 210 may be selected based on the desired end use application of the semiconductor device. For example, the substrate 215 may be composed of any suitable material including, but not limited to, Si, SiGe, SiGeC, SiC, GE alloys, GaAs, InAs, InP, and other III/V or II/VI compound semiconductors. The buried insulator layer 220 may be composed of oxide, such as $SiO_2$, and may be referred to as a buried oxide (BOX) layer 220.

Moreover, although the SOI wafer is referred to as "silicon on insulator," the semiconductor layer 225 is not limited to silicon. Instead, the semiconductor layer 225 may be comprised of various semiconductor materials, such as, for example, Si, SiGe, SiC, SiGeC, etc.

Figure 17:
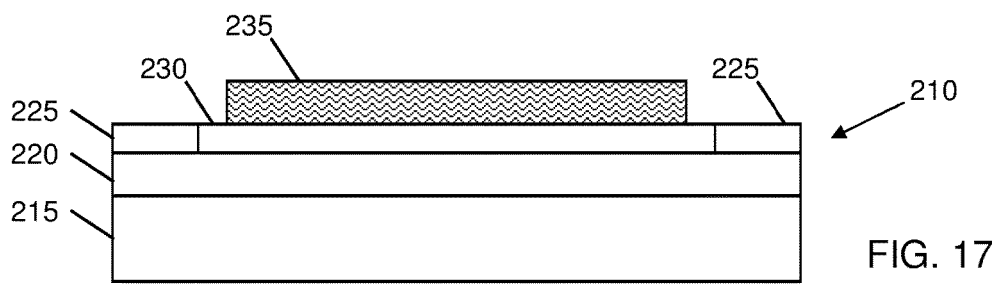

As shown in FIG. 17, a shallow trench isolation (STI) structure 230 is formed in the wafer 210, and a resistor 235 is formed on the STI 230. The STI 230 may be a conventional shallow trench isolation structure formed using conventional semiconductor fabrication processes and materials. For example, the STI 230 may be formed by arranging a photoresist material on the semiconductor layer 225, exposing and developing the photoresist, etching an STI trench in the semiconductor layer 225 through the patterned photoresist (e.g., using an RIE process), stripping the photoresist, filling the trench with an STI material (e.g., $SiO_2$), and planarizing the top surface of the structure (e.g., via CMP). The STI 230 locally replaces a portion of the semiconductor layer 225.

In accordance with aspects of the invention, the resistor 235 is composed of material that has a melting point that causes the resistor 235 to be in a liquid phase at normal operating temperatures of the chip. For example, similar to core 75 described herein, the resistor 235 may be composed of an alloy of Ga and one of and at least one of indium (In), zinc (Zn), tin (Sn), gold (Au), and copper (Cu), in which the ratio of the constituent materials of the alloy is adjusted to achieve a desired melting point for the resistor 235. In embodiments, the ratio of the constituent materials of the alloy is adjusted to cause the resistor to have a melting point in a range of about 40° C. to about 80° C., although the invention is not limited to these values and any suitable melting point may be used. The material of the resistor 235 may be formed using conventional techniques, e.g., CVD, electrodeposition, etc. For example, the material of the resistor 235 may be deposited in a conformal blanket deposition and then patterned to a final shape. As another example, a patterned lift-off mask may first be formed, the material of the resistor 235 formed in an opening of the lift-off mask, and the lift-off mask removed leaving the resistor 235.

One source of variability in resistive metal films is the grain size of the solid metal. A liquid metal film, however, has no grains. Therefore, by using a resistor 235 that is in a liquid phase at normal (e.g., design) operating temperatures of the chip, implementations of the invention eliminate the unwanted variation associated with grain size.

Figure 18:
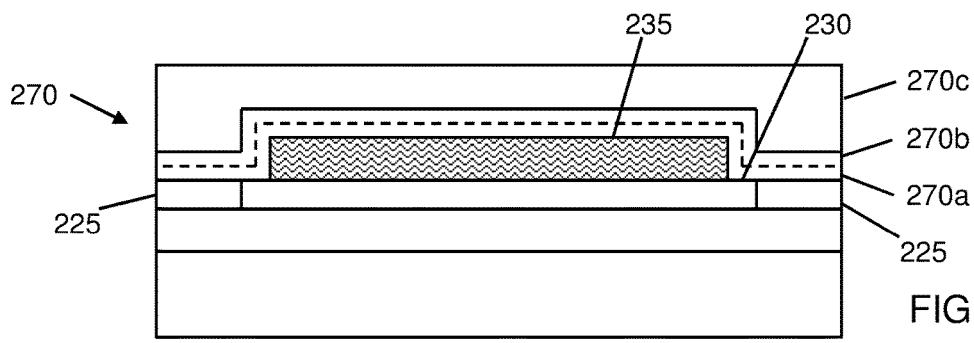

As shown in FIG. 18, a dielectric layer 270 is formed over the resistor 235, portions of the semiconductor layer 225, and STI 230. The dielectric layer 270 may be formed using conventional semiconductor fabrication processes and materials. For example, the dielectric layer 270 may comprise one or more layers of oxide, nitride, oxynitride, or other dielectric materials that are formed using, e.g., CVD. In embodiments, the dielectric layer 270 comprises a thin oxide film 270a formed on the resistor 235 and portions of the semiconductor layer 225 and STI 230, a nitride layer 270b deposited on the oxide film 270a, and an upper layer 270c (e.g., comprising $SiO_2$, BPSG, TESO, HSQ, etc.) deposited on the nitride layer 270b. The oxide film 270a may have a thickness of about 3 nm, the nitride layer 270b may have a thickness of about 20-30 nm, and the upper layer 270c may have a thickness of about 1-6 μm, although the invention is not limited to these dimensions and any suitable thicknesses may be employed within the scope of the invention.

Figure 19:
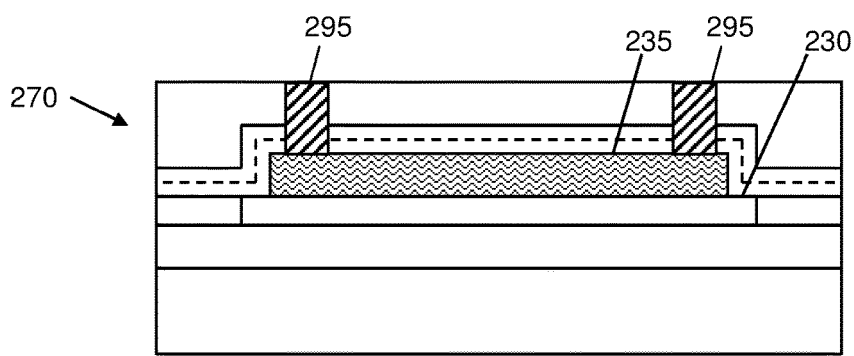

As shown in FIG. 19, resistor contacts 295 are formed in the dielectric layer 270 and in contact with the upper surface of the resistor 235. The resistor contacts 295 may be composed of any suitable electrical conducting material and may be formed using conventional semiconductor processing techniques. For example, the resistor contacts 295 may be formed by masking and etching the dielectric layer 270 to form contact holes in the dielectric layer 270, and depositing metal (e.g., copper or aluminum) in the contact holes (e.g., via CVD).

Figure 20:
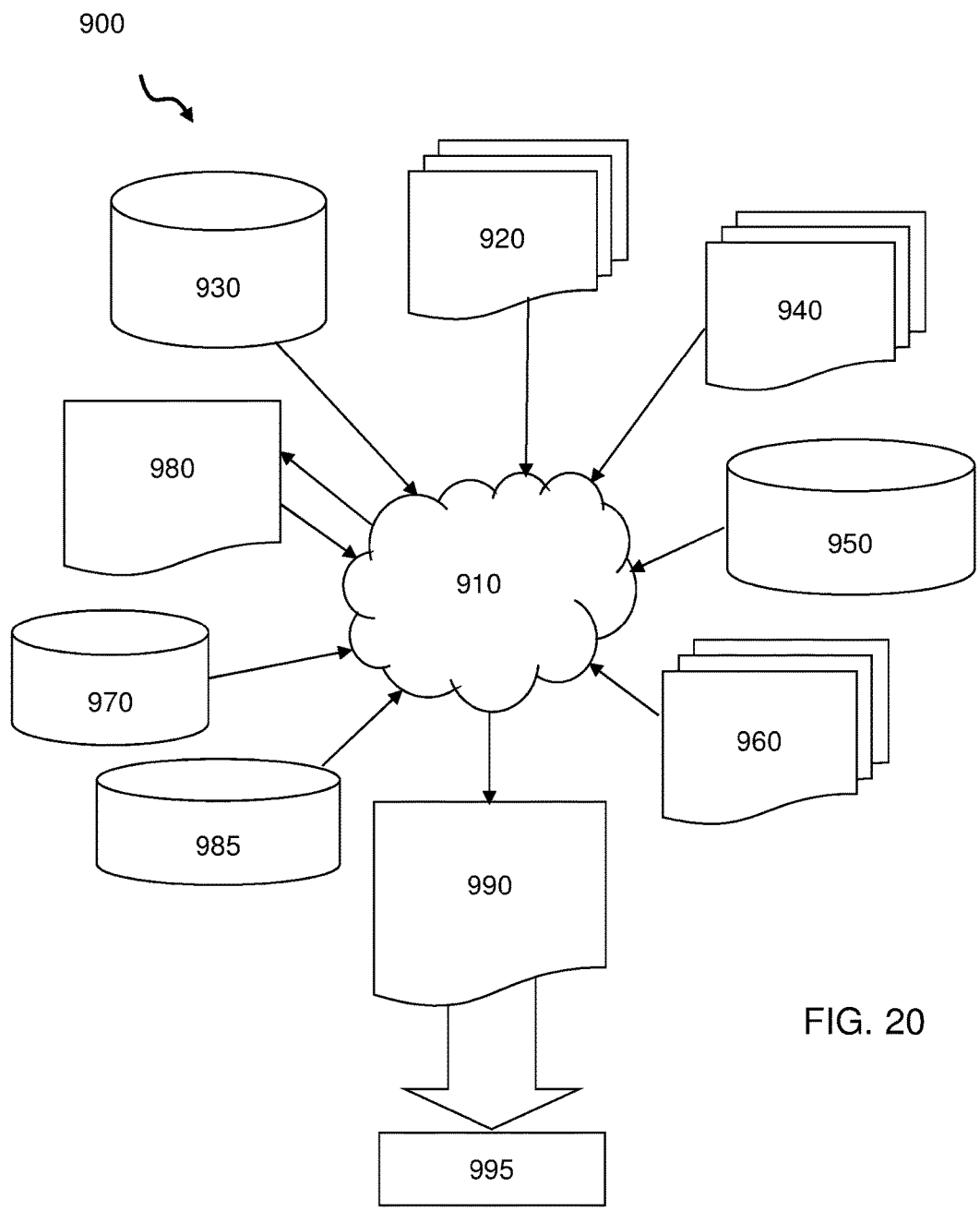
FIG. 20 is a flow diagram of a design process used in semiconductor design, manufacture, and/or test.

FIG. 20 is a flow diagram of a design process used in semiconductor design, manufacture, and/or test. FIG. 20 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-19. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 20 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-19. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-19 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-19. In one embodiment, design structure 990 may comprise a compiled, executable HDL simulation model that functionally simulates the devices shown in FIGS. 1-19.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-19. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A semiconductor structure, comprising:
a device on a substrate of an integrated circuit chip, wherein the device is one of a transistor, a power amplifier, and a power diode, and wherein the substrate is composed of a semiconductor material comprising silicon;
a heat sink completely contained in one or more insulator layers over the device, wherein the heat sink comprises a core that is composed of a phase change material and a liner encapsulating the core; and electrically conductive elements in the one or more insulator layers that provide an electrically conductive pathway to the device, wherein a bottom of the liner directly contacts a top of one of the electrically conductive elements, wherein the phase change material comprises an alloy having a melting point temperature in a range of about 50° C. to about 100° C.

2. The structure of claim 1, wherein the alloy comprising gallium (Ga) and at least one of indium (In), zinc (Zn), tin (Sn), gold (Au), and copper (Cu).

3. The structure of claim 1, further comprising an external heat sink in thermal contact with the heat sink.

4. The structure of claim 1, wherein a lowermost surface of the one or more insulator layers directly contacts the substrate.

5. The structure of claim 1, wherein an interface between the substrate and a lowermost surface of the one or more insulator layers is at a same level as an interface between the substrate and the device.

6. A semiconductor structure, comprising:
a device on a substrate of an integrated circuit chip;
electrically conductive elements in one or more insulator layers over the device, the electrically conductive elements providing an electrically conductive pathway to the device; and a heat sink in the one or more insulator layers and over the device, wherein the heat sink comprises a liner encapsulating a core;

the core is composed of a phase change material having a melting point temperature that is less than an upper limit of a design operating temperature of the chip; and a bottom of the liner directly contacts a top of one of the electrically conductive elements.

7. The structure of claim 6, wherein the phase change material is composed of InGa.

8. The structure of claim 6, wherein the phase change material comprises an alloy comprising gallium (Ga) and at least one of indium (In), zinc (Zn), tin (Sn), gold (Au), and copper (Cu).

9. The structure of claim 6, wherein the alloy has a melting point temperature in a range of about 50° C. to about 100° C.

10. The structure of claim 6, wherein the device comprises a transistor or a power device formed on a contacting a top surface of the substrate.

11. The structure of claim 6, wherein the one or more insulator layers comprise interlevel dielectric (ILD) layers composed of dielectric material comprising one of: tetraethylorthosilicate (TEOS), borophosphosilicate glass (BPSG), and hydrogen silsesquioxane (HSQ).

12. The structure of claim 6, further comprising an external heat sink in thermal contact with the heat sink.

* * * * *